United States Patent
Park et al.

(10) Patent No.: US 7,195,966 B2
(45) Date of Patent: Mar. 27, 2007

(54) METHODS OF FABRICATING SEMICONDUCTOR DEVICES INCLUDING POLYSILICON RESISTORS AND RELATED DEVICES

(75) Inventors: Jin-Taek Park, Gyeonggi-do (KR); Jung-Dal Choi, Gyeonggi-do (KR); Jung-Young Lee, Gyeonggi-do (KR); Hyun-Suk Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 178 days.

(21) Appl. No.: 11/011,644

(22) Filed: Dec. 14, 2004

(65) Prior Publication Data

US 2005/0266634 A1    Dec. 1, 2005

(30) Foreign Application Priority Data

May 25, 2004  (KR) .................. 10-2004-0037463

(51) Int. Cl.
*H01L 21/336* (2006.01)

(52) U.S. Cl. .............. 438/210; 438/238; 438/585; 438/672; 438/700; 438/740; 438/778; 438/970; 438/384; 257/288; 257/350; 257/358; 257/360; 257/379; 257/380; 257/635; 257/637

(58) Field of Classification Search .......... 438/210, 438/238, 382, 673, 761, 778, FOR. 429, 438/635, 585, 669, 672, 700, 740, 763, 787, 438/791, 970, FOR. 401; 257/637, 288, 257/350, 358–360, 379, 380, 635, 640, 649
See application file for complete search history.

(56) References Cited

U.S. PATENT DOCUMENTS 4,786,612 A * 11/1988 Yau et al. .............. 438/384
5,834,815 A * 11/1998 Cheng et al. ............ 257/379

6,023,099 A * 2/2000 Komuro .............. 257/758
6,172,389 B1 * 1/2001 Sakoh ................ 257/296
6,548,851 B2 * 4/2003 Bae et al. ............ 257/306
2004/0175924 A1   9/2004 Choi et al.

FOREIGN PATENT DOCUMENTS

| JP | 2000-077633 | 3/2000 |
|---|---|---|
| KR | 1020000015684 A | 3/2000 |
| KR | 1020010086996 A | 9/2001 |
| KR | 10-2004-0016679 | 2/2004 |

OTHER PUBLICATIONS

Ichige et al., "A Novel Self-Aligned Shallow Trench Isolation Cell for 90nm 4Gbit NAND Flash EEPROMs," *2003 Symposium on VLSI Technology Digest of Technical Papers*, pp. 89-90.
Korean Intellectual Office, "Notice to File a Response/Amendment to the Examination Report" corresponding to Korean Patent Application No. 10-2004-0037463, mailed Dec. 21, 2005.

* cited by examiner

*Primary Examiner*—George R. Fourson
*Assistant Examiner*—Joannie Adelle Garcia
(74) *Attorney, Agent, or Firm*—Myers Bigel Sibley & Sajovec

(57) ABSTRACT

Methods of fabricating semiconductor devices are provided. Transistors are provided on a semiconductor substrate. A first interlayer insulating layer is provided on the transistors. A second interlayer insulating layer is provided on the first interlayer insulating layer. The second interlayer insulating layer defines a trench such that at least a portion of an upper surface of the first interlayer insulating layer is exposed. A resistor pattern is provided in the trench such that the at least a portion of the resistor pattern contacts the exposed portion of the first interlayer insulating layer. Related methods are also provided.

35 Claims, 20 Drawing Sheets

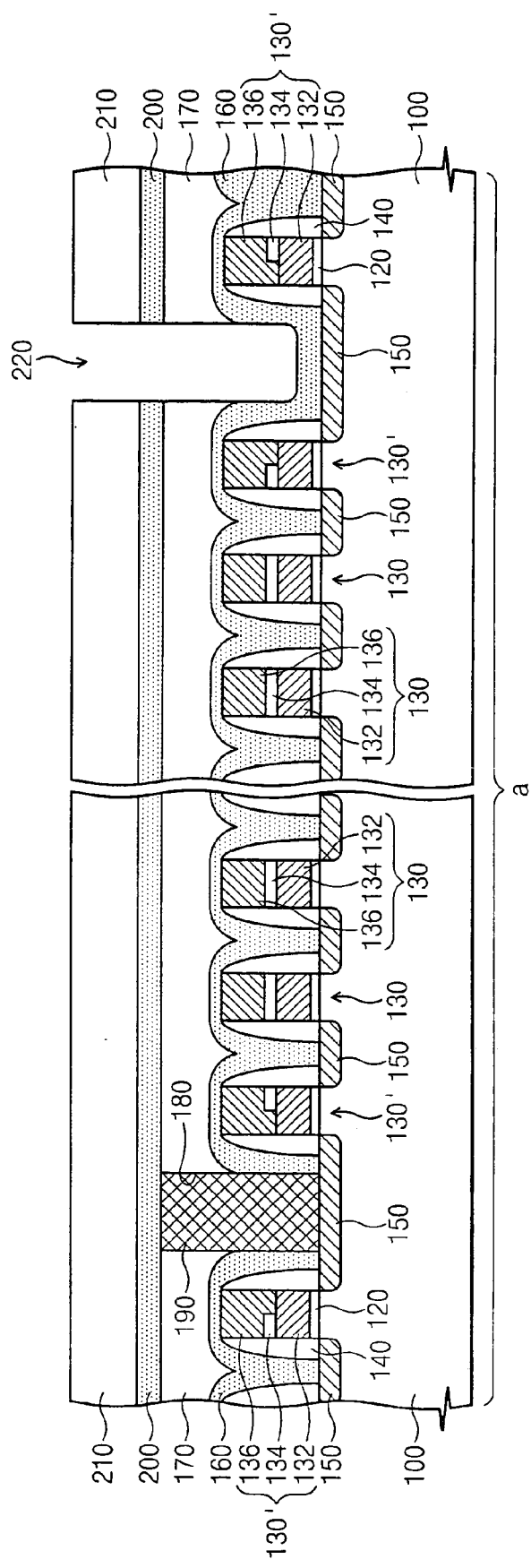

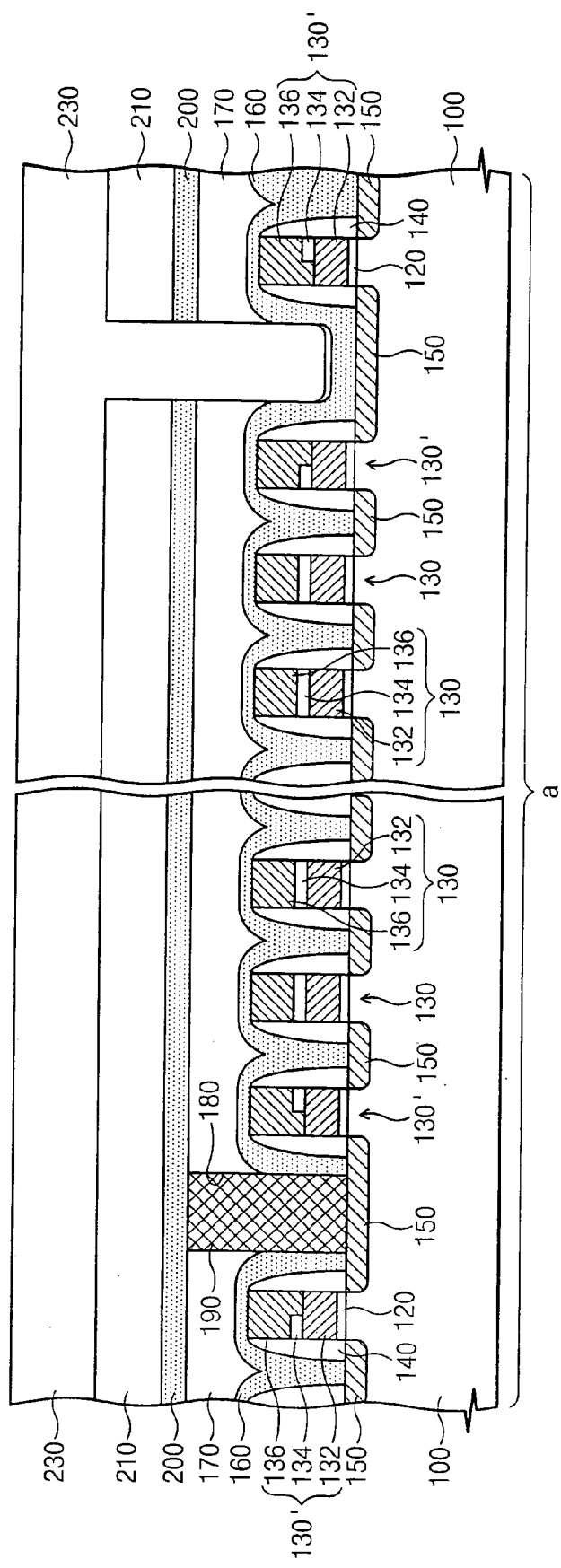

METHODS OF FABRICATING SEMICONDUCTOR DEVICES INCLUDING POLYSILICON RESISTORS AND RELATED DEVICES

CLAIM OF PRIORITY

This application is related to and claims priority from Korean Patent Application No. 2004-37463, filed on May 25, 2004, the disclosure of which is hereby incorporated herein by reference as if set forth in its entirety.

FIELD OF THE INVENTION

The present invention relates to semiconductor devices and methods of fabricating the same and, more particularly, to semiconductor devices having resistors and methods of fabricating the same.

BACKGROUND OF THE INVENTION

Electronic products, such as televisions, telephones, radios, computers and the like, use semiconductor devices including transistors, capacitors, diodes and resistors. These semiconductor devices such as, for example, resistors may play an important role in the operations of an electronic circuit in the electronic product.

Some electronic devices use resistors having large resistances, thus, using metallic materials as an interconnection material may be inappropriate. In other words, a conductive material having a small resistivity may be used and a length of the resistor may be increased to provide the desired resistance. Increasing the length of the resistor may cause the size of the semiconductor chip to increase (i.e. an increase in chip area), which may increase production costs of the semiconductor device. Accordingly, many semiconductor products use polysilicon, a material used for a gate electrode or a contact plug, as a material for the resistor. Since polysilicon is one of materials that may be used in the semiconductor products and has proper resistivity, using polysilicon as a resistor material may allow the chip area of the device to be maintained and may reduce the amount of new materials introduced into the device.

Semiconductor devices having resistors including polysilicon and related methods are discussed in U.S. patent application Publication No. 2004/0175924 entitled Semiconductor Device Having Resistor and Method of Fabricating the Same. A method of fabricating resistors and floating gates of a FLASH memory using the same material is discussed therein. In particular, the floating gate is fabricated using a photolithographic/etching process. However, as semiconductor devices become more highly integrated, methods of forming floating gate electrodes without using a photolithographic/etching process may be desirable, for example, as discussed in *A novel self-aligned shallow trench isolation cell for* 90 nm 4 *Gbit NAND FLASH EEPROMs* (2003 symposium on VLSI technology digest of technical papers, pp. 89–90). As discussed therein, a polysilicon layer used as the floating gate electrode is completely removed from a surface of a device isolation layer in the peripheral circuit region where the resistor is formed. Thus, by definition, the resistor and the floating gate electrode cannot be fabricated using the same process.

Furthermore, uniformity of resistance is another important characteristic associated with a resistor of an electronic device. The uniformity of resistance can be affected by, for example, structural uniformity, such as a thickness of the resistor, resistivity uniformity of the resistor material, contact resistance between the resistor and the interconnection, and the like.

SUMMARY OF THE INVENTION

Some embodiments of the present invention provide methods of fabricating semiconductor devices. Transistors are provided on a semiconductor substrate. A first interlayer insulating layer is provided on the transistors. A second interlayer insulating layer is provided on the first interlayer insulating layer. The second interlayer insulating layer defines a trench such that at least a portion of an upper surface of the first interlayer insulating layer is exposed. A resistor pattern is provided in the trench such that the at least a portion of the resistor pattern contacts the exposed portion of the first interlayer insulating layer.

In further embodiments of the present invention, a first etch stop layer is provided on the transistors and a second etch stop layer is provided on the first interlayer insulating layer. The first etch stop layer may be formed by forming a first etch stop layer of an insulting material having an etch selectivity with respect to the first interlayer insulating layer. The second etch stop layer may be formed by forming the second etch stop layer of an insulating material having an etch selectivity with respect to the second interlayer insulating layer. In certain embodiments of the present invention, the first and second etch stop layers may include silicon nitride and/or silicon oxynitride and the first and second interlayer insulting layers may include silicon oxide.

In still further embodiments of the present invention, the transistors may have source and drain regions and a gate electrode. The first interlayer insulating layer and the first etch stop layer may be patterned to form a source contact opening exposing at least a portion of the source regions. A common source electrode may be provided that is electrically coupled to the source regions in the source contact opening. The second interlayer insulating layer, the second etch stop layer and the first interlayer insulating layer may be patterned to form a temporary bit line contact hole exposing at least a portion of an upper surface of the first etch stop layer on the source or drain region of the transistor.

In some embodiments of the present invention, the trench may be formed by forming a mask pattern exposing a predetermined region of the second interlayer insulating layer on the temporary bit line contact hole. The second interlayer insulating layer may be patterned using the mask pattern as an etch mask to form a temporary trench exposing at least a portion of an upper surface of the second etch stop layer. The mask pattern may be removed and the exposed second etch stop layer may be etched to form a trench exposing the upper surface of the first interlayer insulating layer such that at least a portion of an upper surface of the first etch stop layer exposed by the temporary bit line contact hole under the removed mask pattern is etched, thereby forming a bit line contact hole exposing at least a portion of a source region or a drain region of the transistor.

In further embodiments of the present invention, a conductive layer may be formed in the bit line contact hole and the trench. The conductive layer may be planarized to form a bit line contact plug in the bit line contact hole and the resistor pattern in the trench. The conductive layer may include polysilicon. The planarizing may include planarizing using a chemical-mechanical polishing (CMP) process or a dry etching method. In certain embodiments of the present invention, planarizing may include planarizing until an upper surface of the second etch stop layer is at least partially exposed.

In still further embodiments of the present invention, the second interlayer insulating layer, the second etch stop layer, the first interlayer insulating layer and the first etch stop layer may be successively patterned to form a bit line contact hole exposing at least a portion of the source region or the drain region. In certain embodiments of the present invention, the trench may be formed by patterning the second interlayer insulating layer to form the trench exposing an upper surface of the second etch stop layer. The second interlayer insulating layer may be patterned to form the trench using an etch recipe having an etch selectivity with respect to the second etch stop layer.

In some embodiments of the present invention, the resistor pattern may be formed by forming a conductive layer in the bit line contact hole and the trench. The conductive layer may be planarized to form a bit line contact plug in the bit line contact hole and the resistor pattern in the trench. The conductive layer may include polysilicon.

While the present invention is described above primarily with reference to methods of fabricating semiconductor devices, related devices are also provided herein.

BRIEF DESCRIPTION OF THE DRAWINGS

FIGS. 2A through 8A are cross-sectional views illustrating processing steps in the fabrication of semiconductor devices according to some embodiments of the present invention.

FIGS. 2B through 8B cross-sectional views illustrating processing steps in the fabrication of semiconductor devices according to some embodiments of the present invention.

DETAILED DESCRIPTION OF EMBODIMENTS OF THE PRESENT INVENTION

Figure 1A:
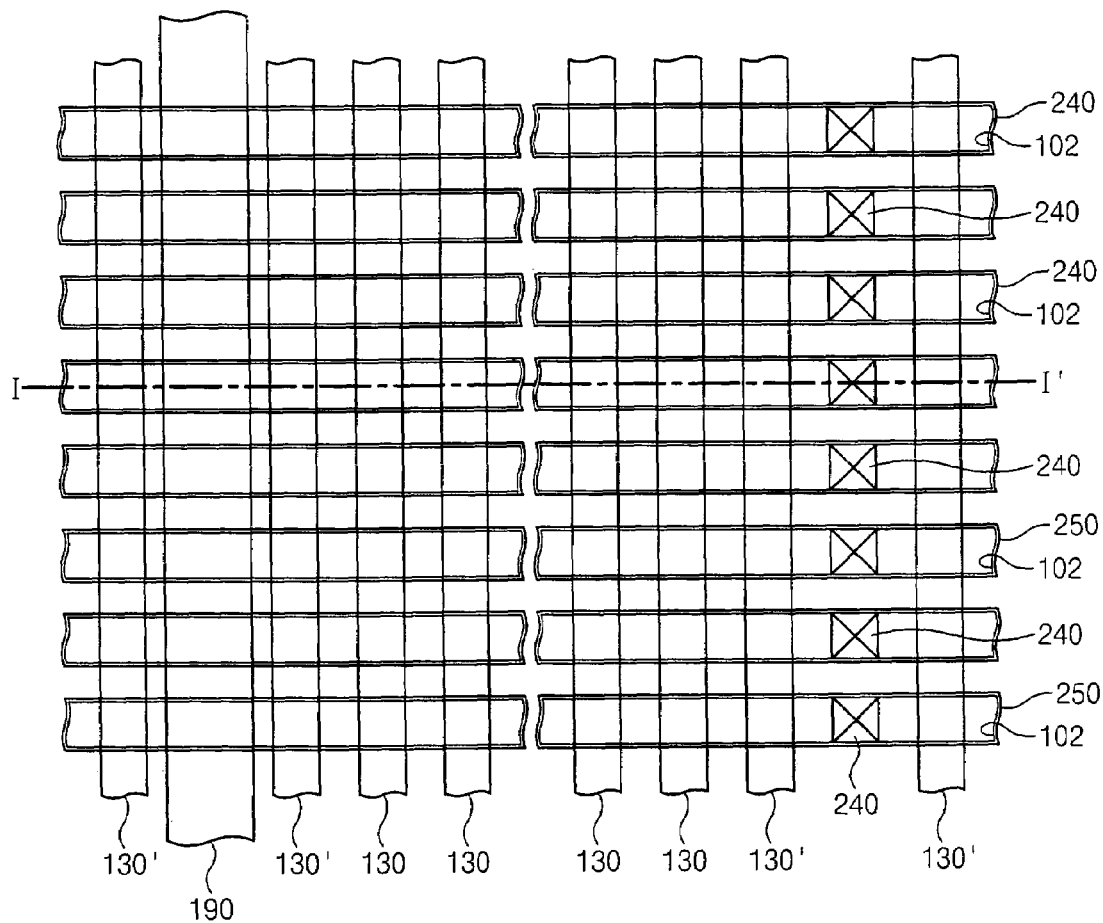
FIGS. 1A through 1B are top plan views of a portion of a cell array region and a peripheral region in semiconductor devices according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
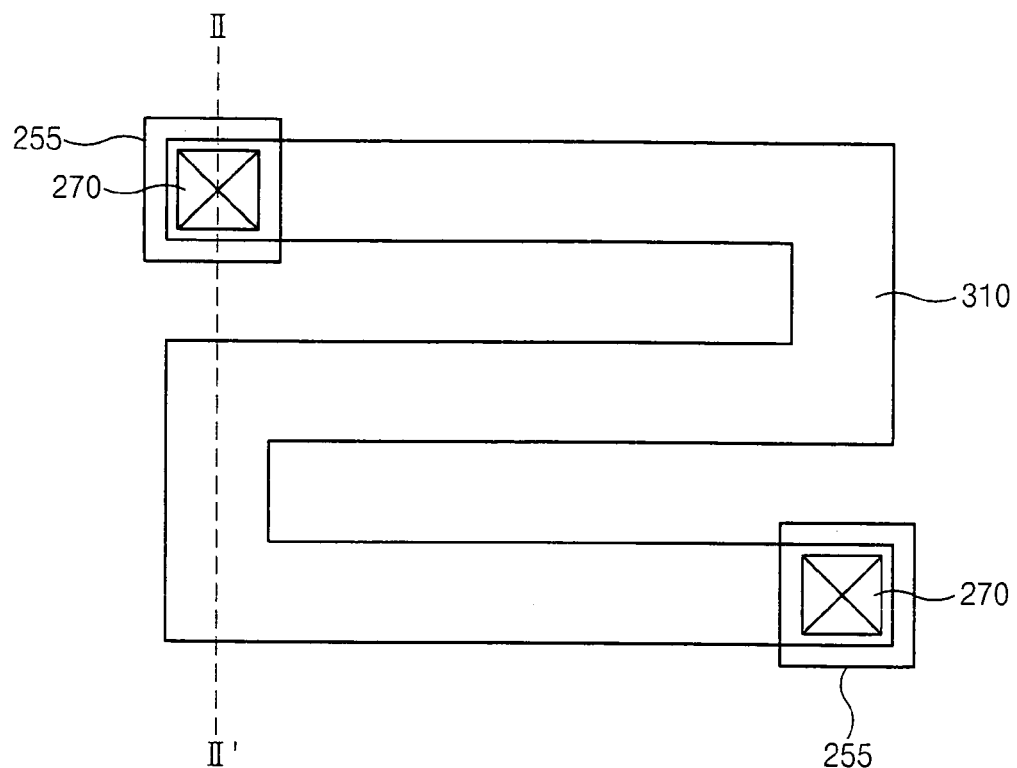
Figure 2A:
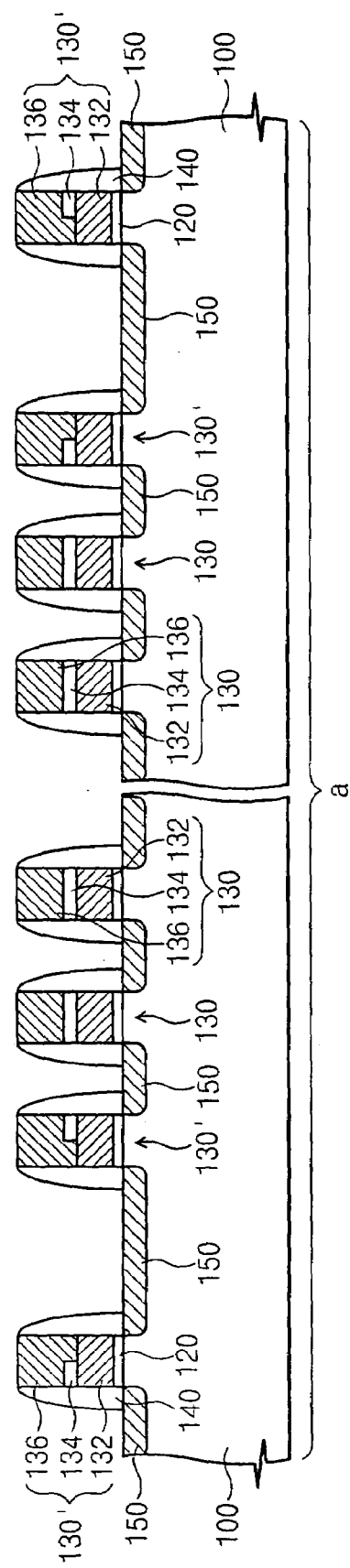
Figure 2B:
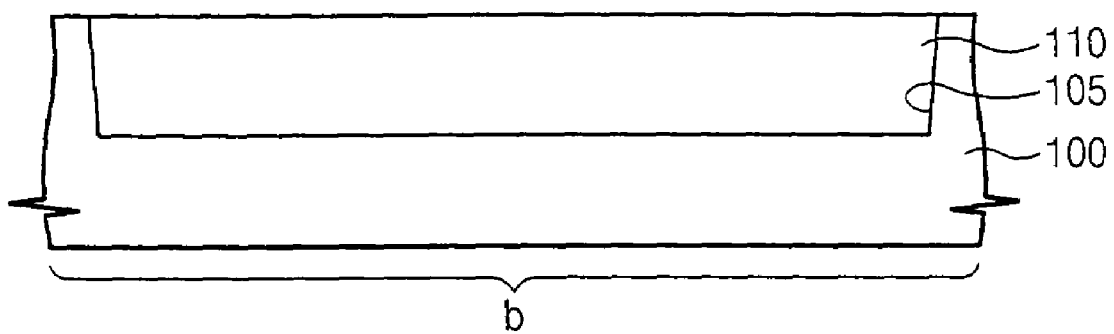
Figure 8A:
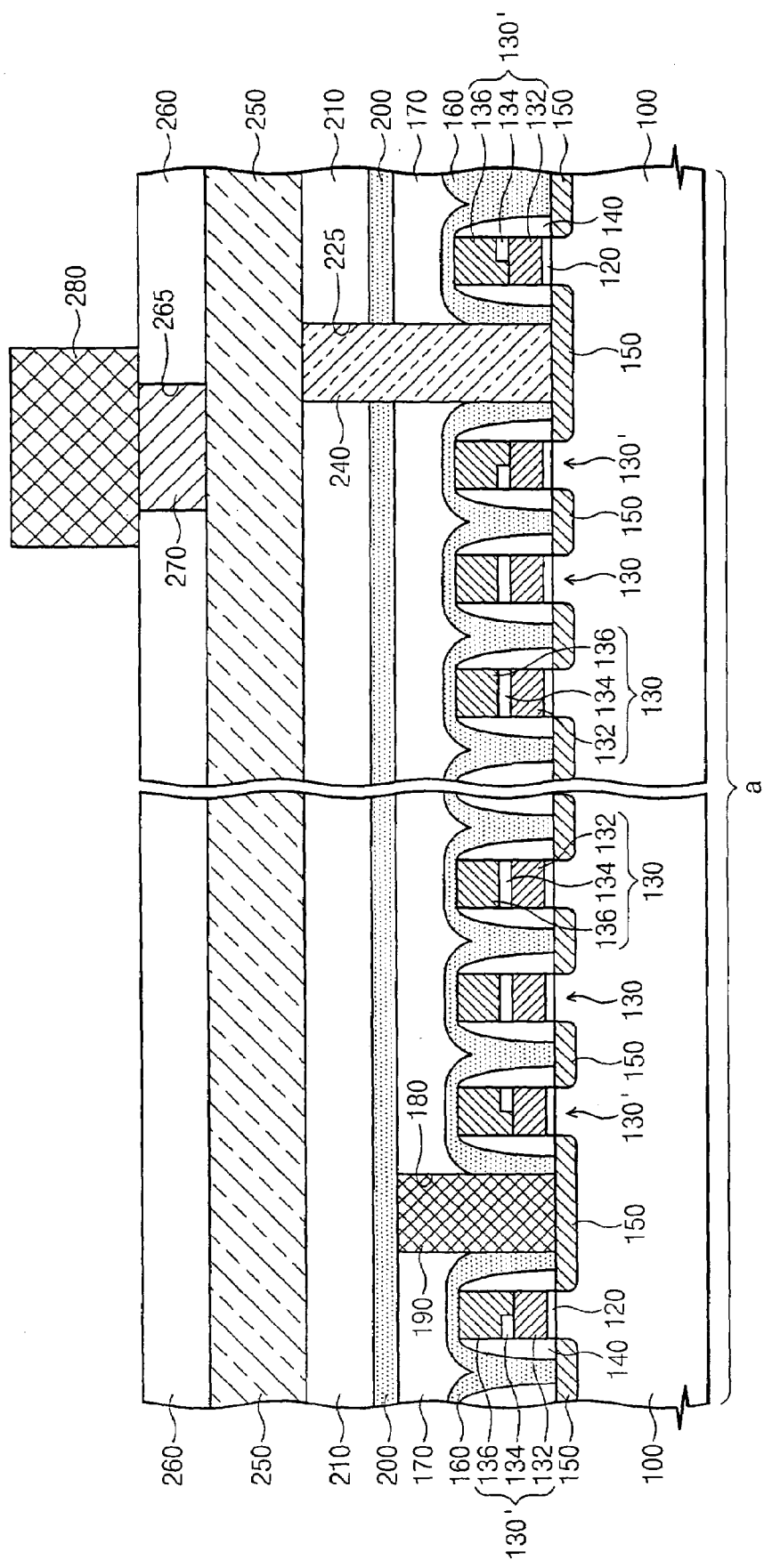
Figure 8B:
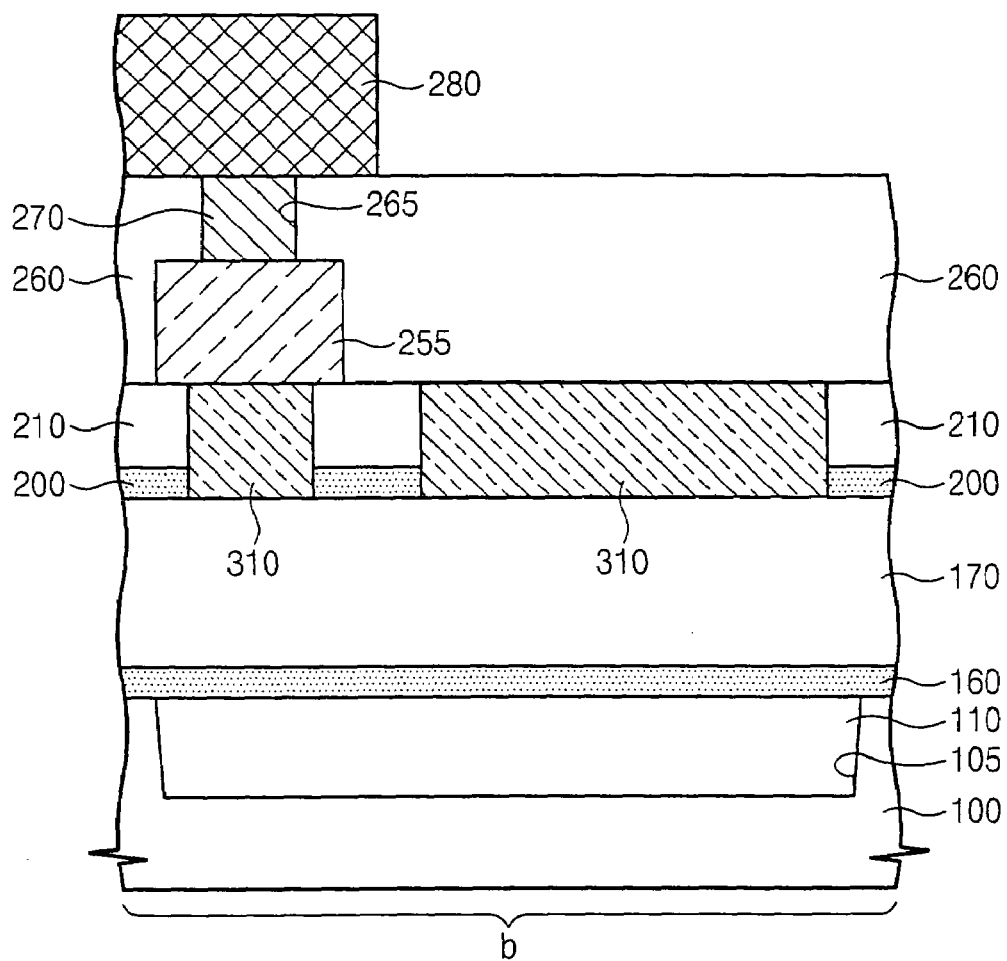

Typically, semiconductor memory chips are divided into a cell array region and a peripheral circuit region. The cell array region is where the cell transistors are disposed and the peripheral circuit region is where logic circuits for driving the cell transistors are disposed. FIG. 1A illustrates a portion of a cell array region of NAND type flash memory devices and FIG. 1B illustrates a portion of a peripheral circuit region. FIG. 8A is a cross-section taken along lines I–I' of FIG. 1A and FIG. 8B is a cross section taken along the line II–II' of FIG. 1B.

Referring now to FIGS. 1A, 1B, 8A and 8B, semiconductor devices having resistor patterns constituting a resistor formed at a different level from the gate electrode according to some embodiments of the present invention will be discussed. A plurality of cell active regions 102 are provided in a cell array region (a) that is defined by a device isolation layer 110. Gate insulating layers 120 are provided on the cell active regions 102. A plurality of gate electrodes 130 are provided on the gate insulating layer 120 to cross over the active regions 102. Impurity regions 150 are provided in the semiconductor substrate 100 between the gate electrodes 130. The impurity regions 150 and the gate electrodes 130 constitute cell transistors that store information.

A first etch stop layer 160 is provided on the semiconductor substrate including the gate electrodes 130, and a first interlayer insulating layer 170 including, for example, silicon, is provided on the first etch stop layer 160. The first etch stop layer 160 may include an insulating layer having an etch selectivity with respect to the first interlayer insulating layer 170. In other words, the first etch stop layer may be an insulating layer capable of having an etch rate slower than that of the first insulating layer 170. The first etch stop layer 160 may be, for example, a silicon nitride layer or a silicon oxynitride layer. Furthermore, gate spacers 140 may be provided between the sidewalls of the gate electrodes 130 and the first etch stop layer 160.

A common source electrode 190 is provided between the gate electrodes 130. The common source electrode 190 extends through the first interlayer insulting layer 170 and the first etch stop layer 160 and contacts the impurity region 150. The common source electrode 190 is parallel to the gate electrode 130 and electrically couples a plurality of impurity regions 150. The impurity regions 150 connected by the common source electrode 190 may be used as source regions of cell transistors. Since the common source region 190 serves as an interconnection that connects several source regions, it may include, for example, a material having low resistivity, such as tungsten.

The gate electrode 130 includes a floating gate electrode 132, a gate interlayer insulating layer 134 and a control gate electrode 136 that are sequentially stacked. The floating gate electrode 132 is provided on one active region 102, but generally does not extend to the neighboring active region 102. In contrast, the control gate electrode 136 is disposed to cross over a plurality of active regions 102 as illustrated in FIG. 1A. In certain embodiments of the present invention related to, for example, NAND flash memory devices, gate electrodes 130' neighboring the common source electrode 190 may be used as select gate lines.

A second etch stop layer 200 and the second interlayer insulating layer 210 are sequentially provided on the first interlayer insulating layer 170 and the common source electrode 190. The second interlayer insulating layer 210 may include, for example, silicon oxide, and the second etch stop layer 200 may include an insulating material, for example, silicon nitride or silicon oxynitride. Furthermore, in some embodiments of the present invention, the second etch stop layer 200 may not have an etch selectivity with respect to the first etch stop layer 160 and may have a thickness similar to that of the first etch stop layer 160.

A bit line contact plug 240 penetrates the second interlayer insulting layer 210, the second etch stop layer 200, the first interlayer insulating layer 170, the first etch stop layer 160 and contacts the impurity region 150. The bit line contact plug 240 is electrically coupled to one impurity region 150. The gate electrodes 130' neighboring the bit line contact plug 240 may also be used as the select gate line. The bit line contact plug 240 may include, for example, polysilicon.

Bit lines 250 are provided on the second interlayer insulating layer 210 and contact the bit line contact plugs 240. The bit lines 250 may be provided to cross over the gate electrodes 130. As a result, the bit lines 250 are provided parallel to the active regions 102. To achieve high operation speed of the semiconductor device, the bit lines 250 may include metallic materials having a small resistivity, such as tungsten or aluminum. Furthermore, a metal interconnection 280 may be electrically coupled to the bit line 250 for a faster operation speed. An upper insulating layer 260 may be provided between the metal interconnection 280 and the bit line 250. A metal contact plug 270 may be provided in the upper insulating layer 260. The metal contact plug 270 electrically couples the metal interconnection 280 and the bit line 250.

A resistor pattern 310 is provided on the first interlayer insulating layer 170 of the peripheral circuit region (b). In some embodiments of the present invention, the resistor pattern 310 may be provided in a trench 305 that is formed in the second etch stop layer 200 and the second interlayer insulating layer 210. Furthermore, the resistor pattern 310 may include a material similar to the material of the contact plug 240, for example, polysilicon.

In further embodiments of the present invention, the resistor pattern 310 may be provided in the trench 305 in the second interlayer insulating layer 210. As illustrated in FIG. 11B, in some embodiments of the present invention, the resistor pattern 310 may have the same thickness as the second etch stop layer 200 and may be provided in the trench 305 in the second etch stop layer 200. Thus, as illustrated, in these embodiments of the present invention, the second interlayer insulating layer 210 may not exist.

The resistor pattern 310 may be electrically coupled to the metal interconnection 280 by the metal contact plug 270. A contact pad 255 including, for example, a similar material as the metal contact plug 270, may be provided between the metal contact plug 270 and the resistor pattern 310.

Figure 9:
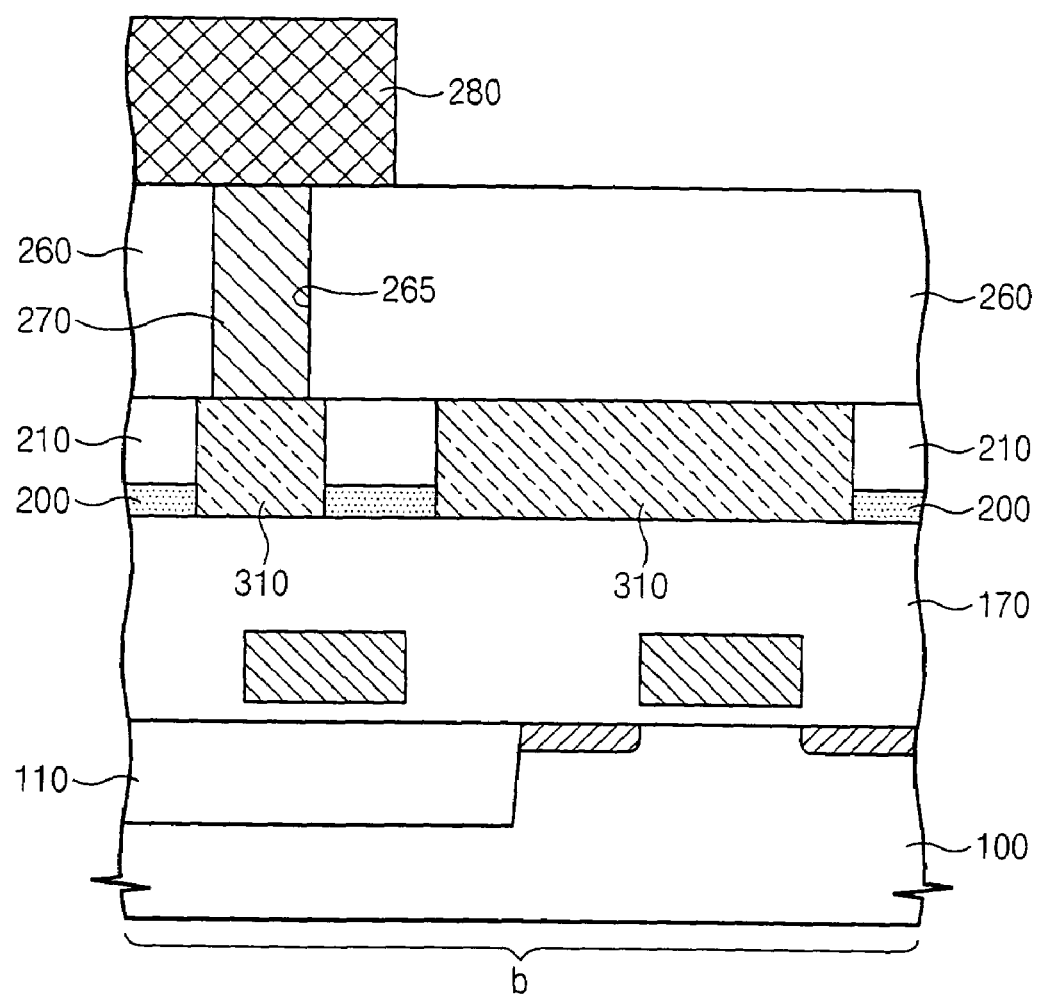
FIGS. 9 and 10 are cross-sectional views of semiconductor devices including resistors according to further embodiments of the present invention.

In some embodiments of the present invention, the resistor patterns 310 may be formed in different levels from that of the gate electrode 130. Therefore, the positions of the resistor patterns 310 may not be limited to being on the device isolation layer 110. For example, as illustrated in FIG. 9, the resistor pattern 310 may be provided on the transistor constituting a logic circuit. Accordingly, more highly integrated semiconductor devices may be fabricated according to some embodiments of the present invention as additional chip area may not be required for the resistor pattern.

Processing steps in the fabrication of semiconductor devices according to some embodiments of the present invention will be discussed with respect to FIGS. 1A through 8A and FIGS. 1B through 8B. FIG. 1A illustrates a portion of a cell array region of, for example, NAND type flash memory devices, and FIG. 1B illustrates a portion of a peripheral circuit region. FIGS. 2A through 8A are cross-sections taken along lines I–I' of FIG. 1A and FIGS. 2B through 8B are cross sections taken along the line II–II' of FIG. 1B.

Referring now to FIGS. 1A, 1B, 2A and 2B, a semiconductor substrate 100 having a cell array region (a) and a peripheral circuit region (b) will be discussed. A device isolation layer 110 is formed in the semiconductor substrate 100 to define active regions 102. A gate insulating layer 120 is formed on the active region 102. Gate electrodes 130 crossing over the active region 102 are formed on a resultant structure including the gate insulating layer 120. In some embodiments of the present invention, the gate electrodes 130 include a floating gate electrode 132, a gate interlayer insulating layer 134 and a gate electrode 136.

The device isolation layer 110 and the gate electrode 130 may be formed by forming a trench mask pattern on the semiconductor substrate 100 and anisotropically etching the semiconductor substrate 100 using the trench mask pattern as an etc. mask. The trenches 105 are formed to define the active regions 102. A first insulating layer is formed in the trench 105 and the first insulating layer is etched using, for example, planarization etching, until the trench mask pattern is at least partially exposed. The device isolation layer 110 is formed in the trench 105, such that the active regions 102 are electrically insulated. Subsequently, the trench mask pattern is removed using, for example, a wet etch method, and a lower conductive layer may be formed on a surface of the resultant structure. The lower conductive layer is provided in a space where the trench mask pattern is removed. The gate insulating layer 120 may be formed before forming the lower conductive layer. The lower conductive layer may be etched using, for example, planarization etching, until at least a portion of an upper surface of the device isolation layer 110 is exposed to form a lower conductive pattern that is provided on the active region 102 and the gate insulating layer 120. The lower conductive layer may be formed of polysilicon.

A second interlayer insulating layer and an upper gate conductive layer are sequentially formed on the resultant structure including the lower conductive pattern. The upper gate conductive layer, the second interlayer insulating layer and the lower conductive pattern are successively patterned to form the gate electrodes 130 perpendicular to the active region 102. In some embodiments of the present invention, a capping insulating pattern (not shown) may be further provided on the control gate electrode 136.

An ion implantation process using the gate electrodes 130 as a mask may be carried out to form impurity regions 150 in the semiconductor substrate 100. Gate spacers 140 may be formed on sidewalls of the gate electrode 130. Furthermore, an ion implantation process may be performed using the gate spacer 140 and the gate electrodes 130 as a mask. In these embodiments of the present invention, the impurity region 150 may have a lightly doped drain (LDD) structure.

Figure 3A:
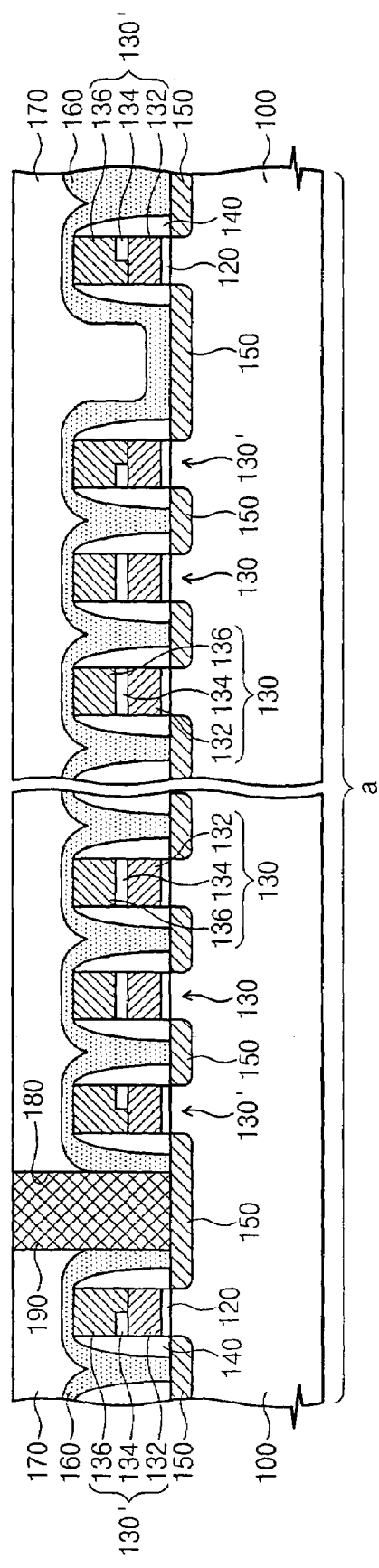
Figure 3B:
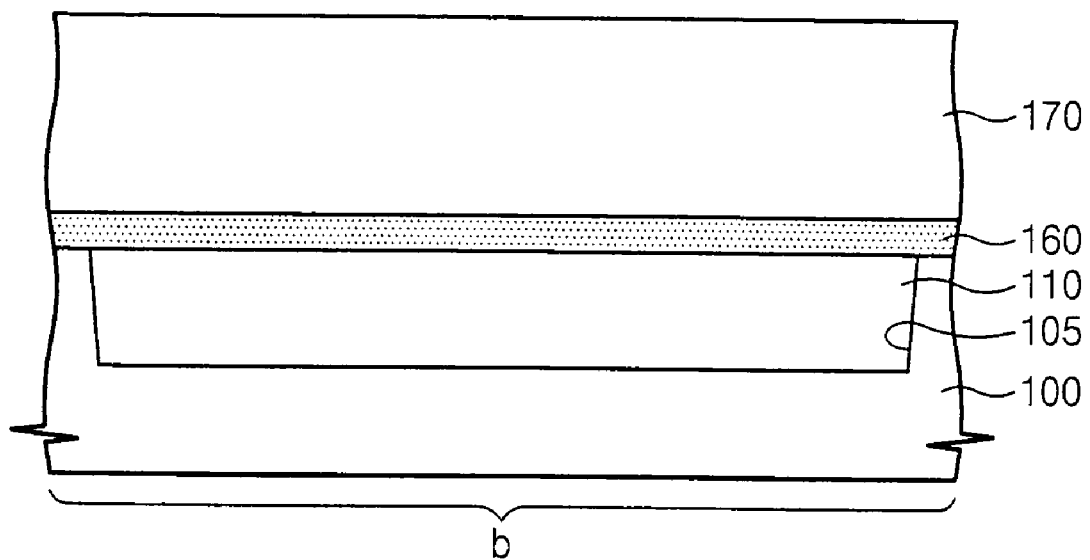

Referring now to FIGS. 3A and 3B, a first etch stop layer 160 and a first interlayer insulating layer 170 are sequentially formed on the resultant structure including the gate spacers 140. The first interlayer insulating layer 170 may include, for example, silicon oxide or other insulating material layers together with silicon oxide layer. The first etch stop layer 160 may be an insulting layer having an etch selectivity with respect to the first interlayer insulating layer 170. In other words, the first etch stop layer 160 may include insulating material having an etch rate with respect to an etch recipe for etching the first interlayer insulating layer 170 that is lower than that of the first interlayer insulating layer 170. For example, if the first interlayer insulating layer 170 includes silicon oxide, the first etch stop layer 160 may include silicon oxide or silicon oxynitride.

The first interlayer insulating layer 170 and the first etch stop layer 160 are patterned to form a source contact opening 180 that exposes at least a portion of an upper surface of the impurity region 150. The source contact opening 180 is formed between the gate electrodes 130 to expose at least a portion of the plurality of impurity regions 150. The source contact opening 180 may be formed by etching the first etch stop layer 160 using an etch recipe having etch selectivity with respect to the first etch stop layer 160 until the first etch stop layer 160 is at least partially exposed, and etching the exposed first etch stop layer 160 using an etch recipe having an etch selectivity with respect to the semiconductor substrate 100 and the device isolation layer 110.

A common source electrode 190 is formed in the source contact opening 180. The common source electrode 190 may be formed by forming a source electrode layer on the semiconductor substrate 100 where the source contact opening 180 is formed, and etching the source electrode layer using, for example, planarization etching until the first interlayer insulating layer 170 is at least partially exposed. The common source electrode 190 may serve as an interconnection that electrically couples the source regions, such that the source electrode layer may be formed of a low resistance material so that the operation speed of the device may be improved. Since the source electrode layer may have a small resistivity, it is typically not used as the material for resistor pattern.

Figure 4B:
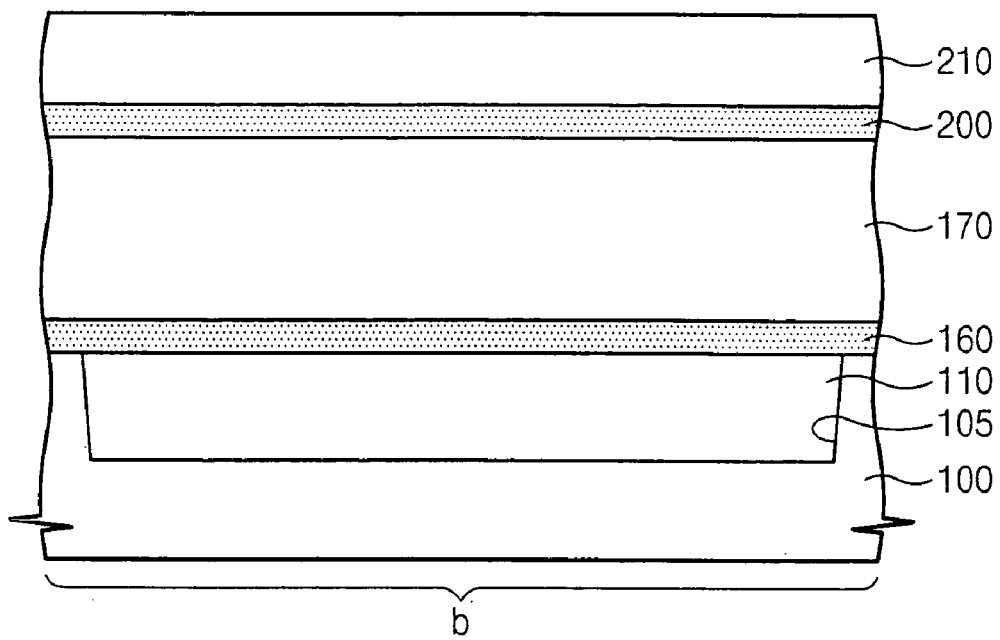

Referring now to FIGS. 4A and 4B, a second etch stop layer 200 and a second interlayer insulating layer 210 are sequentially formed on the semiconductor substrate 100 including the common source electrode 190. The second etch stop layer 200 may include a material that has an etch selectivity with respect to the second interlayer insulating layer 210. As a result, the second etch stop layer 200 may include, for example, silicon nitride or silicon oxynitride. The second interlayer insulating layer 210 may include, for example, silicon oxide so as to satisfy the above etch selectivity with respect to the first etch stop layer 160.

The second interlayer insulating layer 210, the second etch stop layer 200 and the first interlayer insulating layer 170 are patterned to form a temporary bit line contact hole 220 that exposes at least a portion of an upper surface of the first etch stop layer 160 over the impurity region 150 used as a drain region. The temporary bit line contact hole 220 may be formed by etching the second interlayer insulating layer 210 using an etch recipe having an etch selectivity with respect to the second etch stop layer 200, and etching the first interlayer insulating layer 170 using an etch recipe having an etch selectivity with respect to the first etch stop layer 160.

Figure 5B:
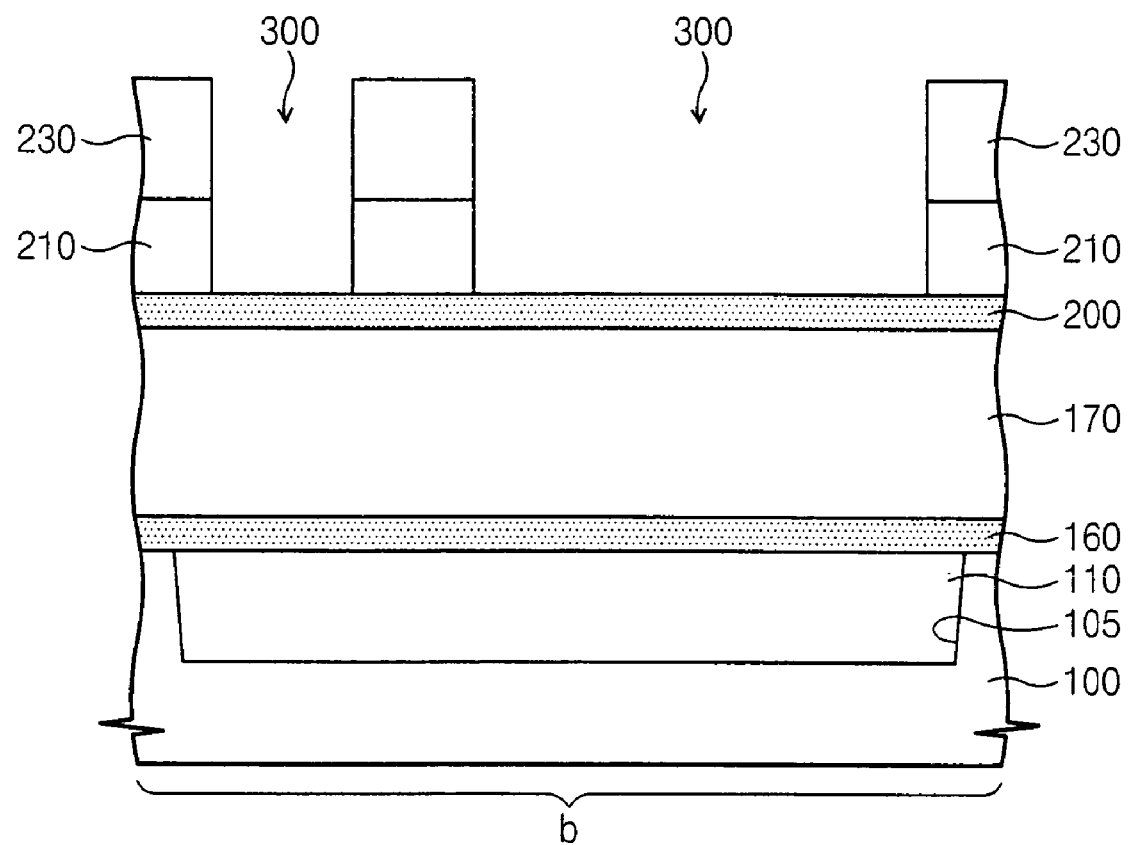

Referring now to FIGS. 5A and 5B, a mask layer is formed on the semiconductor substrate including the temporary bit line contact hole 220 and is patterned to form a mask pattern 230 that exposes at least a portion of the second interlayer insulating layer 210 at the peripheral circuit region. The mask layer may be a photoresist layer.

Using the mask pattern 230 as a mask, the exposed portion of the second interlayer insulating layer 210 is etched using, for example, an anisotropic etching method to form a temporary trench 300 that exposes at least a portion of an upper surface of the second etch stop layer 200. A shape of the resistor pattern to be formed at the peripheral region (b) may be defined by the mask pattern 230 and the temporary trench 300.

Figure 6A:
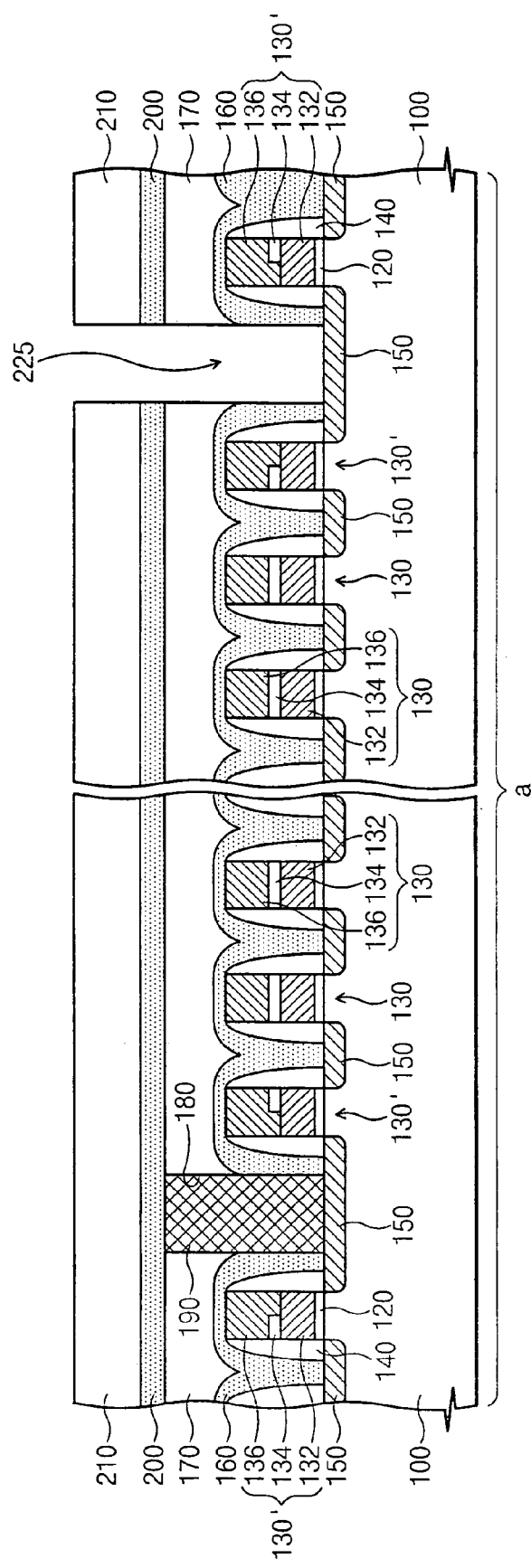
Figure 6B:
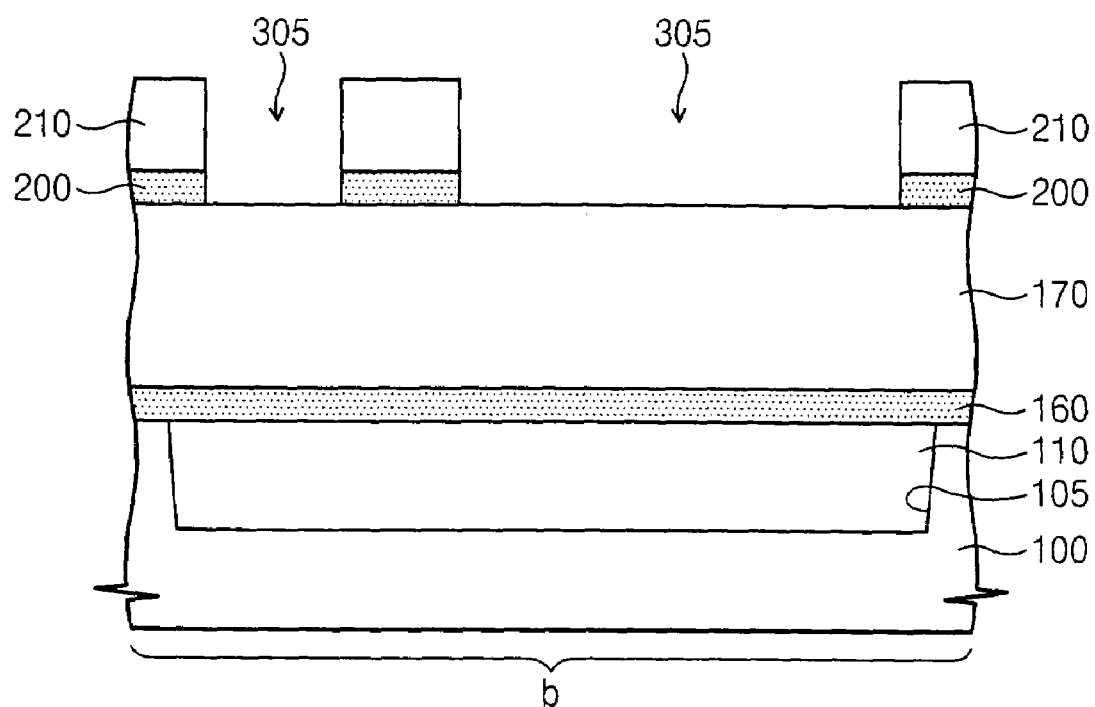

Referring now to FIGS. 6A and 6B, the mask pattern 230 is removed to expose at least a portion of an upper surface of the second interlayer insulating layer 210. The first etch stop layer 160 and the second etch stop layer 200 may be exposed by the temporary bit line contact hole 220 and the temporary trench 300, respectively.

Using the second interlayer insulating layer 210 as an etch mask, the exposed first and second etch stop layers 160 and 200 are etched. The temporary bit line contact hole 220 is extended to form a bit line contact hole 225 that exposes at least a portion of an impurity region 150. The temporary trench 300 is extended to form a trench 305 exposing at least a portion of the first interlayer insluting layer 170. Etching the bit line contact hole 225 and the trench 305 may be performed using an etch recipe having an etch selectivity with respect to the semiconductor substrate 100, the first interlayer insulating layer 170 and the second interlayer insulating layer 210. In some embodiments of the present invention, the first interlayer insulating layer 170 and the second etch stop layer 200 may include different materials, such that the etch process having large etch selectivity is capable of being performed according to the present invention. In other words, the second etch stop layer 200 may be etched selectively, minimizing a recess of the first interlayer insulating layer 170. Accordingly, a distribution of the trench depth 305 according to the position can be reduced.

Figure 7A:
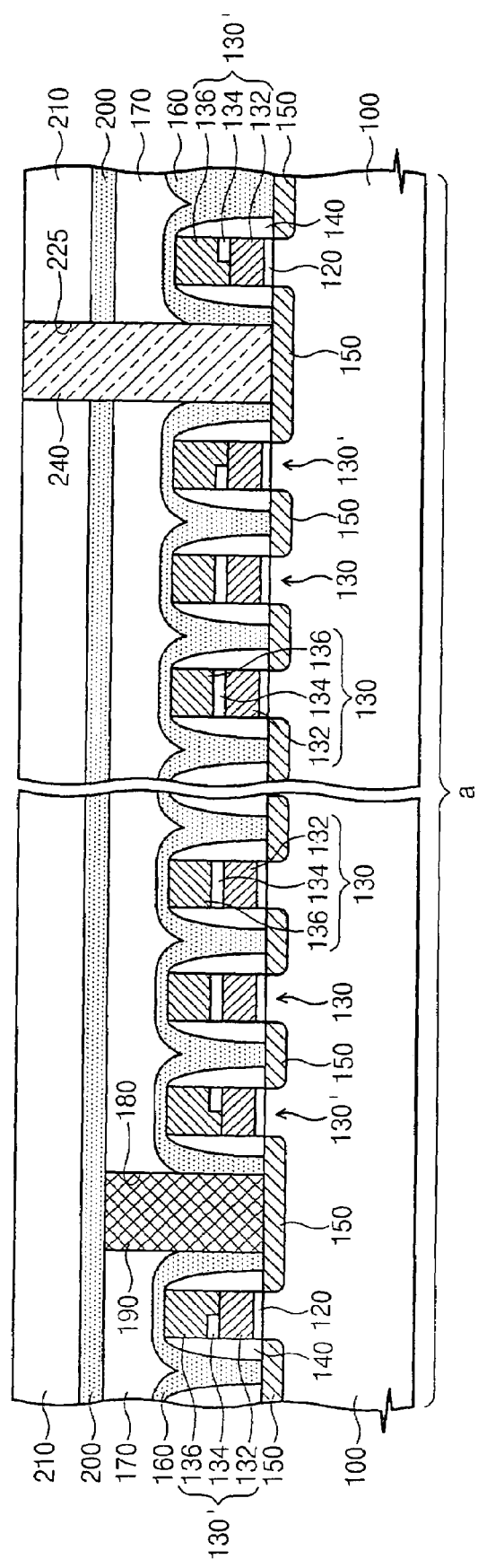
Figure 7B:
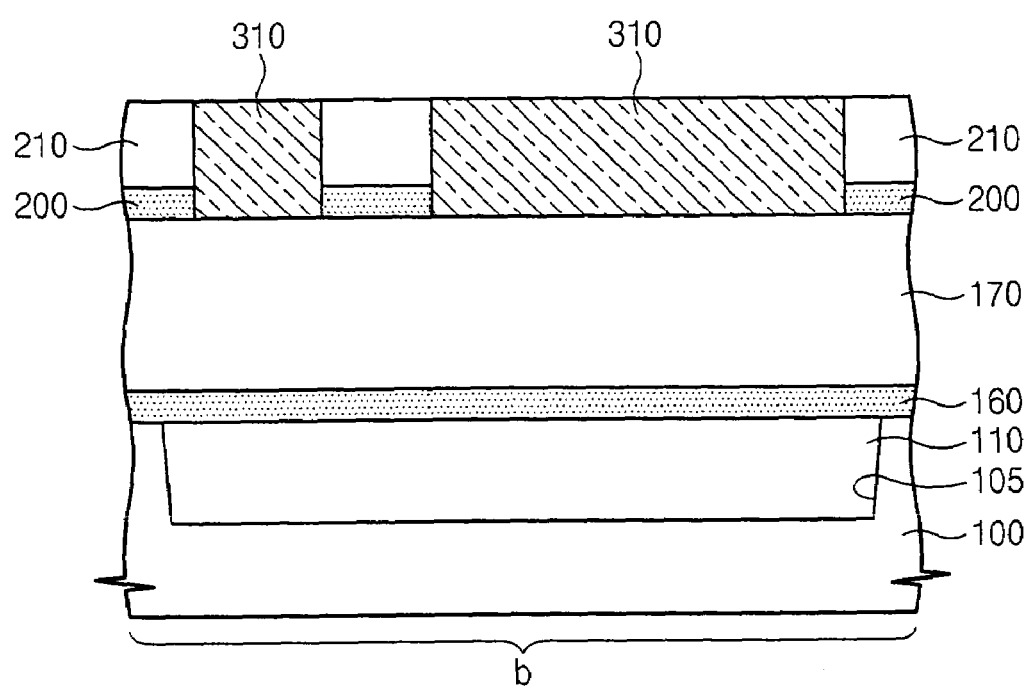

Referring now to FIGS. 7A and 7B, a conductive layer is formed in the trench 305 and the bit line contact hole 225. The conductive layer is etched using, for example, a planarization etching process until at least a portion of an upper surface of the second interlayer insulating layer 210 is exposed. A bit line contact plug 240 is formed in the bit line contact hole 225 such that it contacts the impurity region 150. A resistor pattern 310 is formed in the trench 305 and is formed of the same material as the bit line contact plug 240.

Different from the common source electrode 190, the bit line contact plug 240 is an Interconnection, i.e. a short, connected to one impurity region 150. Therefore, the resistor of the bit line contact plug 240 may not affect an operation speed of the semiconductor device. Accordingly, the bit line contact plug 240 may include polysilicon. The conductive layer may be etched using, for example, a planarization etching method, such as a chemical mechanical polishing (CMP) technique or a dry etch-back technique until at least a portion of an upper surface of the second interlayer insulating layer 210 is exposed.

Figure 11A:
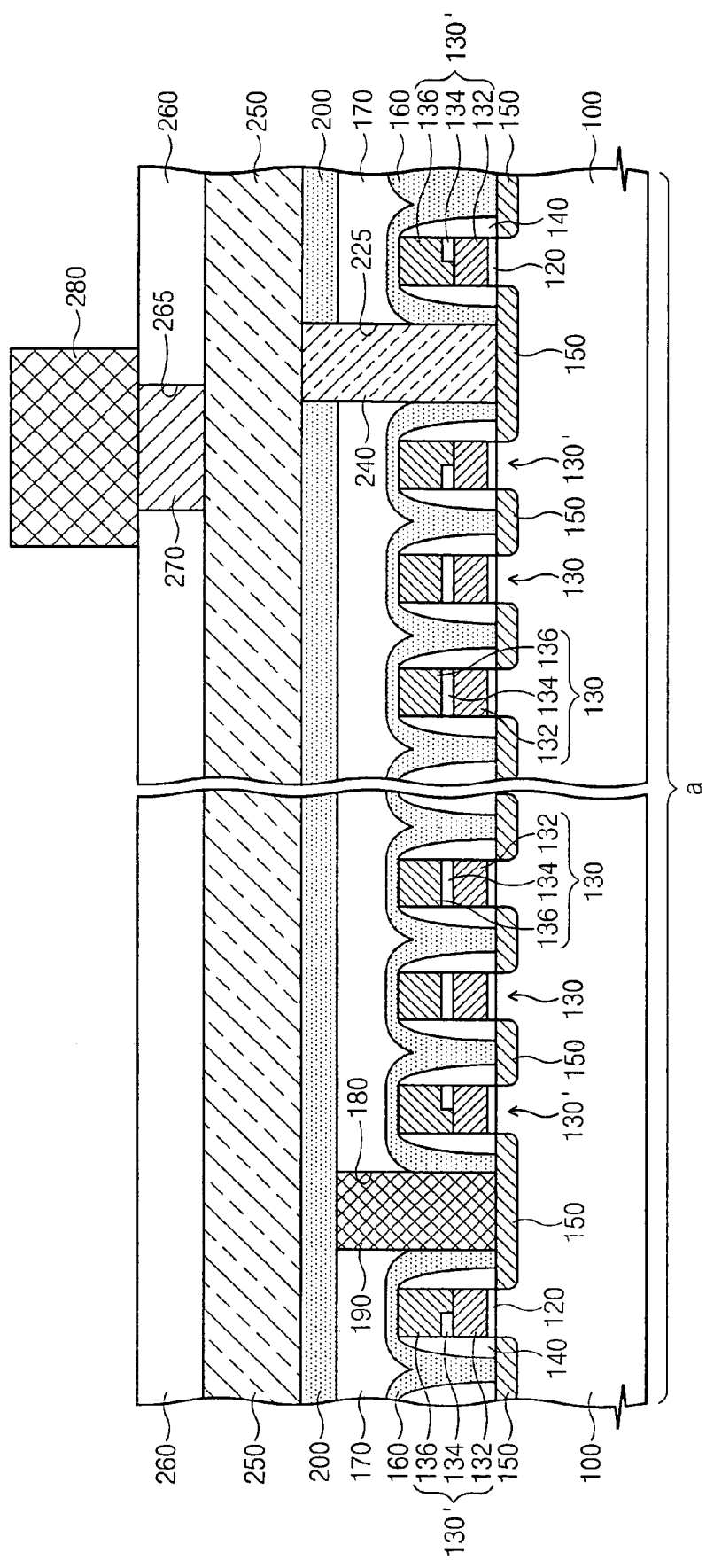
FIGS. 11A through 11B are cross-sectional views of semiconductor devices according to still further embodiments of the present invention.
Figure 11B:
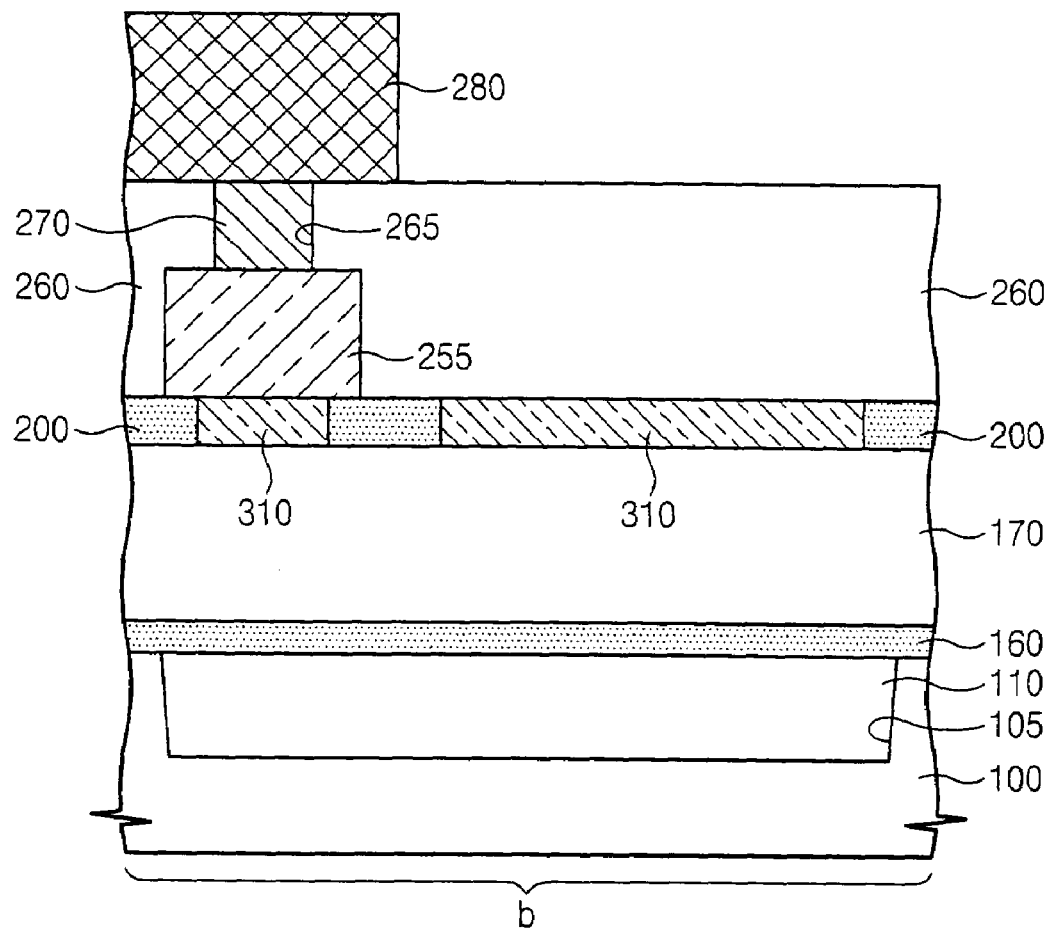

As illustrated in FIGS. 11A and 11B, in some embodiments of the present invention, the second interlayer insulating layer 210 is removed, such that an upper surface of the resistor pattern 310 and the second etch stop layer 200 are substantially planar. As further illustrated therein, the thickness of the second etch stop layer 200 may determine a thickness of the resistor pattern 310. The thickness of the resistor pattern 310 may affect a size of the resistor. Thus, the second etch stop layer 200 may be formed to a suitable thickness considering the desired thickness of the resistor. For example, the second etch stop layer 200 may have a thickness of from about 100 through to about 1000 Å. Furthermore, the first etch stop layer 160 and the second etch stop layer 200 may not have etch selectivity's with respect to each other, such that the first etch stop layer 160 may also have a thickness similar to the second etch stop layer 200.

Furthermore, if the second etch stop layer 200 is used as an etch stop point of the planarization etch process, more uniform etch characteristic may possibly be achieved.

Referring now to FIGS. 8A and 8B, bit lines 250 are formed on the second interlayer insulating layer to contact the bit line contact plug 240. The bit line 250 may include, for example, a metallic material, such as tungsten, copper and aluminum. An upper insulating layer 260 is formed on the resultant structure where the bit line 250 is formed, and the upper insulating layer 260 is patterned to form a metal contact hole 265 that exposes at least a portion of the bit line 250. A metal contact plug 270 is formed in the metal contact hole 265 and a metal interconnection 280 is formed to contact the metal contact plug 270 on the upper insulating layer 260.

In some embodiments of the present invention, a contact pad 255 may be formed between the resistor pattern 310 and the metal contact plug 270. The contact pad 255 may be formed simultaneously with the bit line 250. Therefore, the contact pad 255 may be formed of the same material as the bit line 250. In further embodiments of the present invention, the metal contact plug 270 may be directly connected to the resistor pattern 310 without the contact pad 255 (FIG. 9). In these embodiments of the present invention, the material constituting the bit line 250 may be removed on the resistor pattern 310 in the process of forming the bit line 250.

The resistor pattern 310 may be formed to be in a different level from that of the transistor, such that the limitation on the disposition position is reduced. For example, the resistor pattern 310 may be formed over the active region where the transistors constituting a logic circuit are formed, as illustrated, for example, in FIG. 9. Therefore, the chip area can be used more effectively and more highly integrated semiconductor device may be fabricated.

Figure 10:
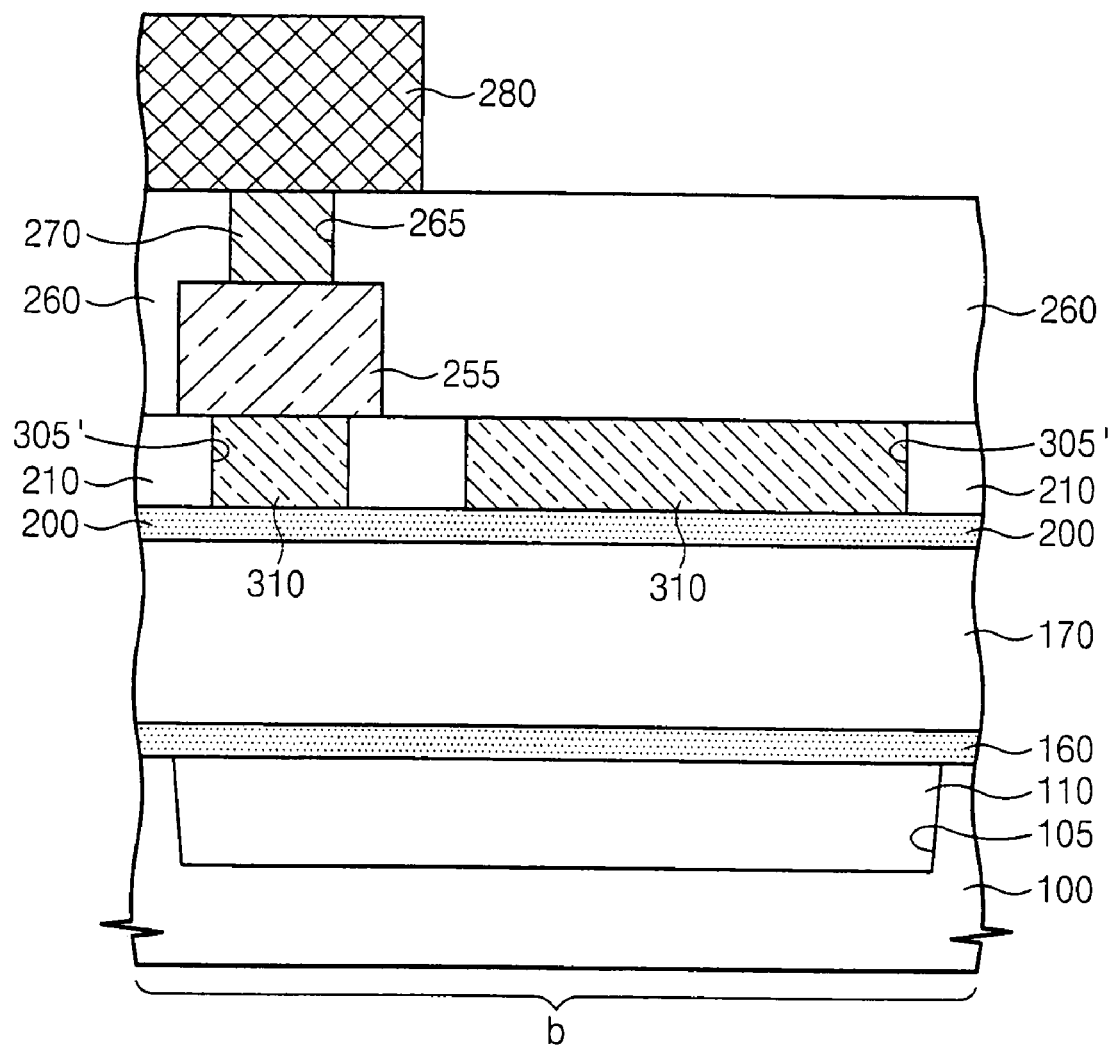

In further embodiments of the present invention illustrated in FIG. 10, the temporary trench 300 may replace the trench 305 that includes the resistor pattern 310. In other words, the trench 305 may be formed to expose at least a portion of an upper surface of the second etch stop layer 200 and penetrate the second interlayer insulating layer 210. The temporary bit line contact holed 300 is formed and the exposed first etch stop layer 160 is further etched to form a bit line contact hole 225 that exposes at least a portion of the impurity region 150. A trench 305' exposing an upper surface of the second etch stop layer 200 is formed using the mask pattern 230. The trench 305' corresponds to the temporary trench 300 discussed above. The mask pattern 230 is removed and the resistor pattern 310 and the bit line contact plug 240 are formed in the trench 305' and the bit line contact hole 225, respectively. In these embodiments of the present invention, the resistor pattern 310 is formed to contact the second etch stop layer 200. Since the second etch stop layer 200 is a material having good etch selectivity with respect to the second interlayer insulating layer 210, the etch process for forming the trench 305' may be closely controlled to have a uniform etch depth. Accordingly, the resistor pattern 310 may be formed to have a uniform thickness and, thus, a semiconductor device having a more uniform resistor characteristic can be fabricated.

As briefly discussed above, a resistor pattern may be formed on an interlayer insulating layer using a process for forming a plug pattern, for example, a bit line contact plug, that is connected to impurity regions in a cell array region of a semiconductor device. Thus, the resistor pattern can be formed independent from a gate electrode. Accordingly, the process of forming the resistor pattern may be simplified according to some embodiments of the present invention.

Furthermore, the resistor pattern is provided on the interlayer insulating layer, such that additional chip area may not be required for the resistor pattern. Thus, a more highly integrated semiconductor device may possibly be fabricated. As further discussed above, a thickness of the resistor pattern may be controlled regularly using an etch stop layer. Thus, a semiconductor device having good electric characteristic, i.e., a resistor having a uniform size can be fabricated.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of fabricating semiconductor devices comprising:
    forming transistors having source and drain regions on a semiconductor substrate;
    forming a first interlayer insulating layer on the transistors;
    forming a second interlayer insulating layer on the first interlayer insulating layer;
    patterning the first and second interlayer insulating layers to form a trench defined by the second interlayer insulating layer and a bit line contact hole that penetrates through the first and second interlayer insulating layers; and
    forming a resistor pattern to fill the trench and forming a bit line contact plug in the bit line contact hole to penetrate through the first and second interlayer insulating layers to directly contact at least one of the source and drain regions.

2. The method of claim 1, wherein forming the first interlayer insulating layer is preceded by forming a first etch stop layer on the transistors and wherein forming the second interlayer insulating layer is preceded by forming a second etch stop layer on the first interlayer insulating layer.

3. The method of claim 2, wherein forming the first etch stop layer comprises forming the first etch stop layer of an insulating material having an etch selectivity with respect to the first interlayer insulating layer and wherein forming the second etch stop layer comprises forming the second etch stop layer of an insulating material having an etch selectivity with respect to the second interlayer insulating layer.

4. The method of claim 2, wherein the first and second etch stop layers comprise silicon nitride and/or silicon oxynitride and wherein the first and second interlayer insulating layers comprise silicon oxide.

5. The method of claim 2, wherein forming the second etch stop layer is preceded by:
    patterning the first interlayer insulating layer and the first etch stop layer to form a source contact opening exposing at least a portion of the source regions; and
    forming a common source electrode that is electrically coupled to the source regions in the source contact opening.

6. The method of claim 2, wherein forming the trench is preceded by patterning the second interlayer insulating layer, the second etch stop layer and the first interlayer insulating layer to form a temporary bit line contact hole exposing at least a portion of an upper surface of the first etch stop layer on the source or drain region of the transistor.

7. The method of claim 6, wherein the trench is formed by:
    forming a mask pattern exposing a region of the second interlayer insulating layer on the temporary bit line contact hole;
    patterning the second interlayer insulating layer using the mask pattern as an etch mask to form a temporary trench exposing at least a portion of an upper surface of the second etch stop layer;
    removing the mask pattern; and
    simultaneously etching the exposed portion of the second etch stop layer and a portion of an upper surface of the first etch stop layer exposed by the temporary bit line contact hole to form the trench exposing the upper surface of the first interlayer insulating layer and the bit line contact hole exposing at least a portion of the source region or the drain region.

8. The method of claim 7, wherein forming the resistor pattern comprises:
    forming a conductive layer in the bit line contact hole and the trench; and
    planarizing the conductive layer to form the bit line contact plug in the bit line contact hole and the resistor pattern in the trench.

9. The method of claim 8, wherein the conductive layer comprises polysilicon.

10. The method of claim 8, wherein planarizing comprises using a chemical-mechanical polishing (CMP) process or a dry etching method.

11. The method of claim 8, wherein planarizing comprises planarizing until an upper surface of the second interlayer insulating layer is at least partially exposed.

12. The method of claim 2, wherein patterning the first and second interlayer insulating layers comprises:
    successively patterning the second interlayer insulating layer, the second etch stop layer, the first interlayer insulating layer and the first etch stop layer to form the bit line contact hole exposing at least a portion of the source region or the drain region; and
    patterning the second interlayer insulating layer to form the trench exposing a top surface of the second etch stop layer.

13. The method of claim 12, wherein patterning the second interlayer insulating layer to form the trench comprises etching the second interlayer insulating layer using an etch recipe having an etch selectivity with respect to the second etch stop layer.

14. The method of claim 13, wherein the forming the resistor pattern comprises:
    forming a conductive layer in the bit line contact hole and the trench; and
    planarizing the conductive layer to form the bit line contact plug in the bit line contact hole and the resistor pattern in the trench.

15. The method of claim 14, wherein the conductive layer comprises polysilicon.

16. The method according to claim 1 wherein the bit line contact plug comprises a unitary bit line contact plug.

17. A method of fabricating a semiconductor device including a resistor on a semiconductor substrate having a cell array region and a peripheral circuit region comprising:
    forming transistors having source and drain regions and a gate electrode on the semiconductor substrate;
    sequentially forming a first etch stop layer and a first interlayer insulating layer on the transistors;

sequentially forming a second etch stop layer and a second interlayer insulating layer on the first interlayer insulating layer;

patterning the second interlayer insulating layer, the second etch stop layer and the first interlayer insulating layer to expose at least a portion of an upper surface of the first etch stop layer over a drain region of the transistor;

patterning the second interlayer insulating layer and the second etch stop layer to form a trench exposing at least a portion of an upper surface of the first interlayer insulating layer;

etching the exposed first etch stop layer to form a bit line contact hole exposing an upper surface of the drain region; and simultaneously forming a resistor pattern in the trench and a bit line contact plug in the bit line contact hole, the bit line contact plug penetrating through the first and second interlayer insulating layers and penetrating through the first and second etch stop layers to directly contact at least one of the source and drain regions.

18. The method of claim 17, wherein the first and second etch stop layers comprise silicon nitride and/or silicon oxynitride and wherein the first and second interlayer insulating layers comprise silicon oxide.

19. The method of claim 17 wherein forming the resistor pattern and the bit line contact plug comprises:
forming a conductive layer in the bit line contact hole and the trench; and
planarizing the conductive layer to form the bit line contact plug in the bit line contact hole and the resistor pattern in the trench, wherein the conductive layer comprises polysilicon.

20. The method of claim 19, wherein planarizing comprises planarizing the conductive layer until an upper surface of the second interlayer insulating layer is at least partially exposed.

21. A semiconductor device comprising:
a semiconductor substrate;
transistors on the semiconductor substrate, the transistors having source and drain regions and a gate electrode;
a first interlayer insulating layer on the transistors;
a second interlayer insulating layer defining a trench on the first interlayer insulating layer;
a resistor pattern in the trench defined by the second interlayer insulating layer; and
a contact plug penetrating through the first and second interlayer insulating layers and directly contacting at least one of the source and drain regions, wherein the resistor pattern and the contact plug comprise a common material and have different thicknesses.

22. The device of claim 21, further comprising:
a first etch stop layer on the transistors between the transistors and the first interlayer insulating layer; and
a second etch stop layer on the first interlayer insulating layer between the first interlayer insulating layer and the second interlayer insulating layer.

23. The device of claim 22, wherein the first etch stop layer comprises an insulating material having an etch selectivity with respect to the first interlayer insulating layer and wherein the second etch stop layer comprises an insulating material having an etch selectivity with respect to the second interlayer insulating layer.

24. The device of claim 22, wherein the first and second etch stop layers comprise silicon nitride and/or silicon oxynitride and wherein the first and second interlayer insulating layer comprise silicon oxide.

25. The device of claim 22 further comprising:
a common source electrode in a source contact opening to be electrically coupled to the source regions, wherein the source contact opening is formed to penetrate the first interlayer insulating layer and the first etch stop layer and expose at least a portion of the source regions.

26. The device of claim 25 wherein the second etch stop layer, the first interlayer insulating layer and the first etch stop layer define a bit line contact hole that penetrates the second etch stop layer, the first interlayer insulating layer and the first etch stop layer and exposes at least a portion of the source region or the drain region, and wherein the contact plug fills the bit line contact hole to contact directly with at least one of the exposed source region and the exposed drain region.

27. The device of claim 22 wherein the second interlayer insulating layer, the second etch stop layer, the first interlayer insulating layer and the first etch stop layer define a bit line contact hole that penetrates the second interlayer insulating layer, the second etch stop layer, the first interlayer insulating layer and the first etch stop layer and exposes at least a portion of the source region or the drain region, and wherein the contact plug fills the bit line contact hole to contact directly with at least one of the exposed source region and the exposed drain region.

28. A semiconductor device including a cell array region and a peripheral circuit region, comprising:
a plurality of cell transistors disposed on the cell array region including impurity regions and a gate electrode;
a first etch stop layer on the cell transistors;
a first interlayer insulating layer on the first etch stop layer;
a resistor mold layer on the first interlayer insulating layer to define a trench exposing an upper surface of the first interlayer insulating layer in the peripheral region;
a contact plug that penetrates through the resistor mold layer, the first interlayer insulating layer and the first etch stop layer to directly contact the impurity region in the cell array region; and
a resistor pattern in the trench, wherein the contact plug and the resistor pattern are formed of a common material having different thicknesses.

29. The device of claim 28, wherein the first etch stop layer and the resistor mold layer comprise silicon nitride and/or silicon oxynitride and wherein the first interlayer insulating layer comprises silicon oxide.

30. The device of claim 28, wherein the resistor mold layer comprises:
a second etch stop layer on the first interlayer insulating layer;
a second interlayer insulating layer on the second etch stop layer, the second etch stop layer and the second interlayer insulating layer having etch selectivities relative to each other.

31. The device of claim 30, wherein the first etch stop layer and the second etch stop layer comprise silicon nitride and/or silicon oxynitride and wherein the first interlayer insulating layer and the second interlayer insulating layer comprise insulating materials including silicon oxide.

32. The device of claim 28, wherein the gate electrode comprises a floating gate electrode, a gate interlayer insulating layer and a control gate electrode that are sequentially stacked.

33. The device of claim 28, further comprising a second etch stop layer between the first interlayer insulating layer and the resistor pattern.

34. The device of claim 28, wherein the contact plug and the resistor pattern comprise polysilicon.

35. The device of claim 28, wherein the thickness of the resistor pattern is from about 100 Å to about 1000 Å.

* * * * *